United States Patent
Lien et al.

(10) Patent No.: US 12,237,003 B2
(45) Date of Patent: Feb. 25, 2025

(54) MANAGEMENT OF DYNAMIC READ VOLTAGE SEQUENCES IN A MEMORY SUBSYSTEM

(71) Applicant: Micron Technology, Inc., Boise, ID (US)

(72) Inventors: Yu-Chung Lien, San Jose, CA (US); Zhenming Zhou, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 316 days.

(21) Appl. No.: 17/881,180

(22) Filed: Aug. 4, 2022

(65) Prior Publication Data

US 2024/0046981 A1     Feb. 8, 2024

(51) Int. Cl.
| | |
|---|---|
| G11C 16/04 | (2006.01) |
| G11C 11/4074 | (2006.01) |
| G11C 11/4076 | (2006.01) |
| G11C 11/4096 | (2006.01) |

(52) U.S. Cl.
CPC ...... *G11C 11/4096* (2013.01); *G11C 11/4074* (2013.01); *G11C 11/4076* (2013.01)

(58) Field of Classification Search
CPC ........... G11C 11/4096; G11C 11/4074; G11C 11/4076
See application file for complete search history.

(56) References Cited

U.S. PATENT DOCUMENTS

| | | | |
|---|---|---|---|
| 9,684,459 B2 * | 6/2017 | Kondo | G06F 12/0862 |
| 11,003,395 B2 * | 5/2021 | Park | G11C 16/26 |
| 11,893,269 B2 * | 2/2024 | Ryu | G06F 3/0659 |

* cited by examiner

*Primary Examiner* — Pho M Luu
(74) *Attorney, Agent, or Firm* — NICHOLSON DE VOS WEBSTER & ELLIOTT LLP (57) ABSTRACT

A memory subsystem receives a first read command and a second read command. Responsive to determining that the first read command originated from a host system, the memory subsystem selects a reverse read trim setting. Responsive to determining that the second read command did not originate from the host system, the memory subsystem selects a forward read trim setting. The memory subsystem executes the first read command using the reverse read trim setting. The memory subsystem executes the second read command using the forward read trim setting.

20 Claims, 6 Drawing Sheets

MANAGEMENT OF DYNAMIC READ VOLTAGE SEQUENCES IN A MEMORY SUBSYSTEM

CROSS-REFERENCE TO RELATED APPLICATION

This present application is related to U.S. application Ser. No. 17/817,465, filed Aug. 4, 2022 and entitled "MEMORY READ OPERATION USING A VOLTAGE PATTERN BASED ON A READ COMMAND TYPE."

TECHNICAL FIELD

The present disclosure generally relates to execution of read commands in a memory subsystem and, more specifically, relates to managing dynamic sequences of read voltages.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to dynamically managing the sequence of read voltages in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information. Example memory cells include transistor circuits such as metal oxide silicon transistors (MOS transistor). Each memory cell in the plane can be addressed by a bit line and a word line combination. Each word line is coupled to a word line decoder, and each bit line is coupled to a bit line decoder.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Both host systems and media management processes internal to the memory subsystem issue commands to read data from media or write data to media. For example, the memory subsystem may issue a read command for error mitigation. A memory system can mitigate errors via an internal process of reading the memory (i.e., performing a media or data integrity scan) and reprogramming data from one or more locations within subdivisions of memory when, e.g., an indication of error(s) for the memory location(s) reaches a threshold value. Additionally, the memory subsystem can receive read commands from host systems.

In general, a read operation involves applying a voltage to a word line. The memory subsystem uses word lines and bit lines to access memory cells of the memory subsystem. By applying a charge to the word line, the transistor gate (e.g., a memory cell of the memory subsystem) opens, allowing any stored charge of the transistor to flow to a decoder, mapping the charge to a bit value. For example, a memory cell can represent different bit values through the application of different threshold voltage values to the transistor gate.

As described herein, a trim setting can provide voltage information, including a sequence of voltage thresholds corresponding to one or more memory cells, used to program or access the memory cells. For example, an SLC can store one of two possible bit values ("0" and "1") and each of two different threshold voltages can be applied to the gate of the transistor in a read operation. The threshold voltage results in source/drain conduction indicating the current state of the bit value. Similarly, MLC, TLC, and QLC memory represent more than two possible bit values and have a corresponding additional number of different threshold voltage values used in a read operation to determine the current bit values. Applying an increasing sequence of threshold voltages to the word line is considered a "forward read operation." That is, the forward read operation is performed on lower threshold voltage states of a word line before higher threshold voltage states of the word line.

Applying a decreasing sequence of threshold voltages to the word line is considered a "reverse read operation." That is, the reverse read operation is performed on higher threshold voltage states of a word line before lower threshold voltage states of the word line. Both forward read operations and reverse read operations are associated with advantages and disadvantages. For example, reverse read operations are faster than forward read operations. However, forward read operations are more power efficient than reverse read operations. Conventionally, read operation sequences are static. For example, some memory subsystems are configured to perform forward read operations. Other memory subsystems are configured to perform reverse read operations. As a result, memory subsystems using a static read voltage sequence accept a universal tradeoff between power efficiency and speed for all read operations.

Aspects of the present disclosure address the above and other deficiencies by dynamically selecting a read voltage sequence and corresponding trim settings based on the origination of the read operation. For example, the memory subsystem can prioritize speed for read operations originating from the host system, improving user experience, while taking advantage of power efficiency for internal read operations for which speed can be a lower priority. As a result of the memory subsystem dynamically selecting forward read operations and reverse read operations, the performance of the memory subsystem is improved by conserving power for some read operations while improving the speed in which a read operation is performed for other operations.

Figure 1:
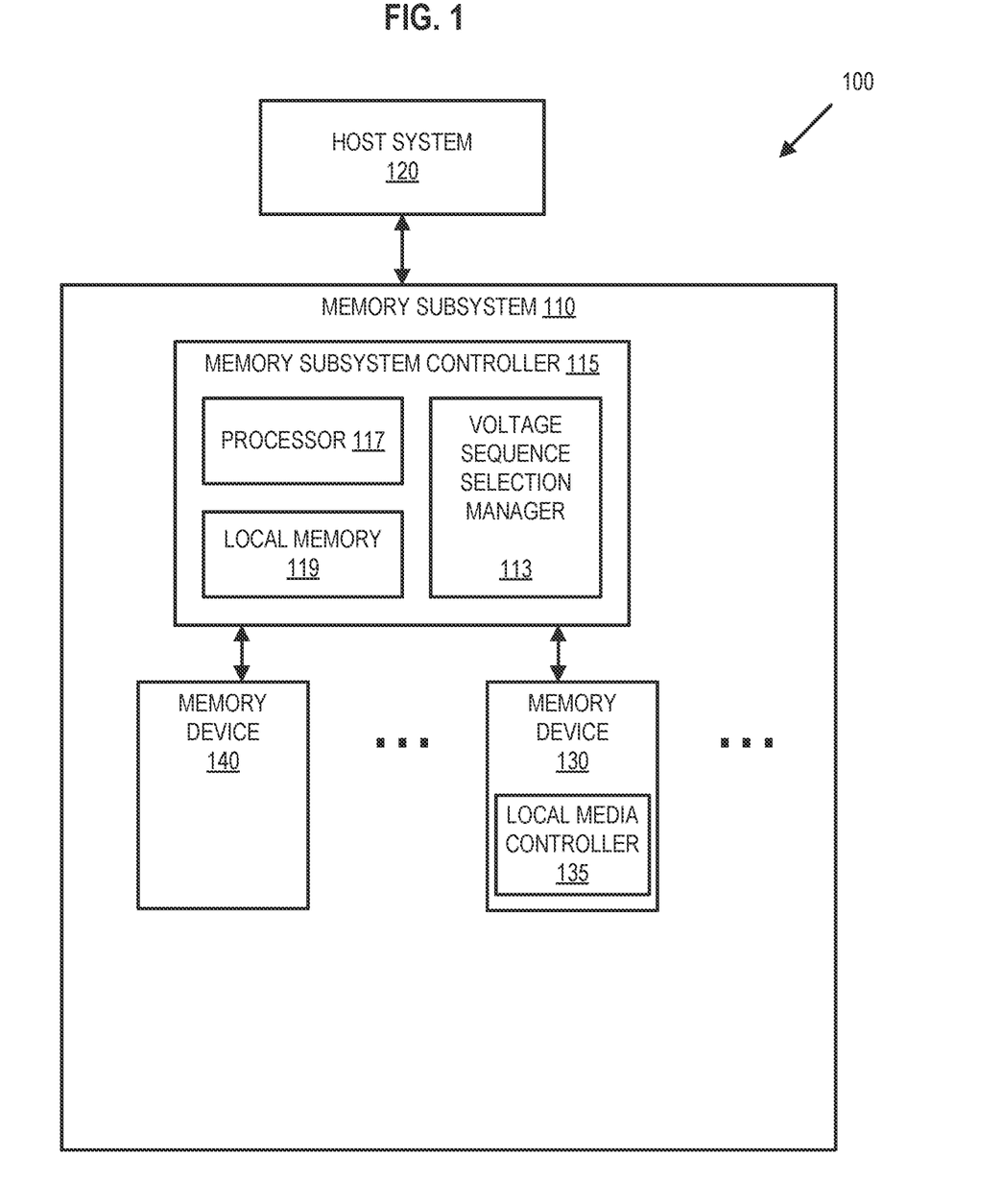
FIG. 1 illustrates an example computing system that includes a memory subsystem in accordance with some embodiments of the present disclosure.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a voltage sequence selection manager 113 that selects a voltage sequence (e.g., an increasing sequence of voltage thresholds corresponding to a "forward read operation" or a decreasing sequence of voltage thresholds corresponding to a "reverse read operation") based on an origination of the read operation (e.g., an external origination with respect to the memory subsystem 110 or an internal origination with respect to the memory subsystem 110). The voltage sequence selection manager 113 can dynamically transition between or otherwise select read operation trim settings (e.g., forward read operations and reverse read operations). In some embodiments, the controller 115 includes at least a portion of voltage sequence selection manager 113. For example, the controller 115 can include a processor 117 (processing device) configured to execute instructions stored in local memory 119 for performing the operations described herein. In some embodiments, a voltage sequence selection manager 113 is part of the host system 120, an application, or an operating system.

The voltage sequence selection manager 113 can determine an origin of a read command and, based on the origin of the read command, select trim setting(s) associated with the read command. The voltage sequence selection manager 113 then executes the read command using the respective trim settings (e.g., a forward read operation or a reverse read operation). Further details with regards to the operations of the voltage sequence selection manager 113 are described below.

Figure 2:
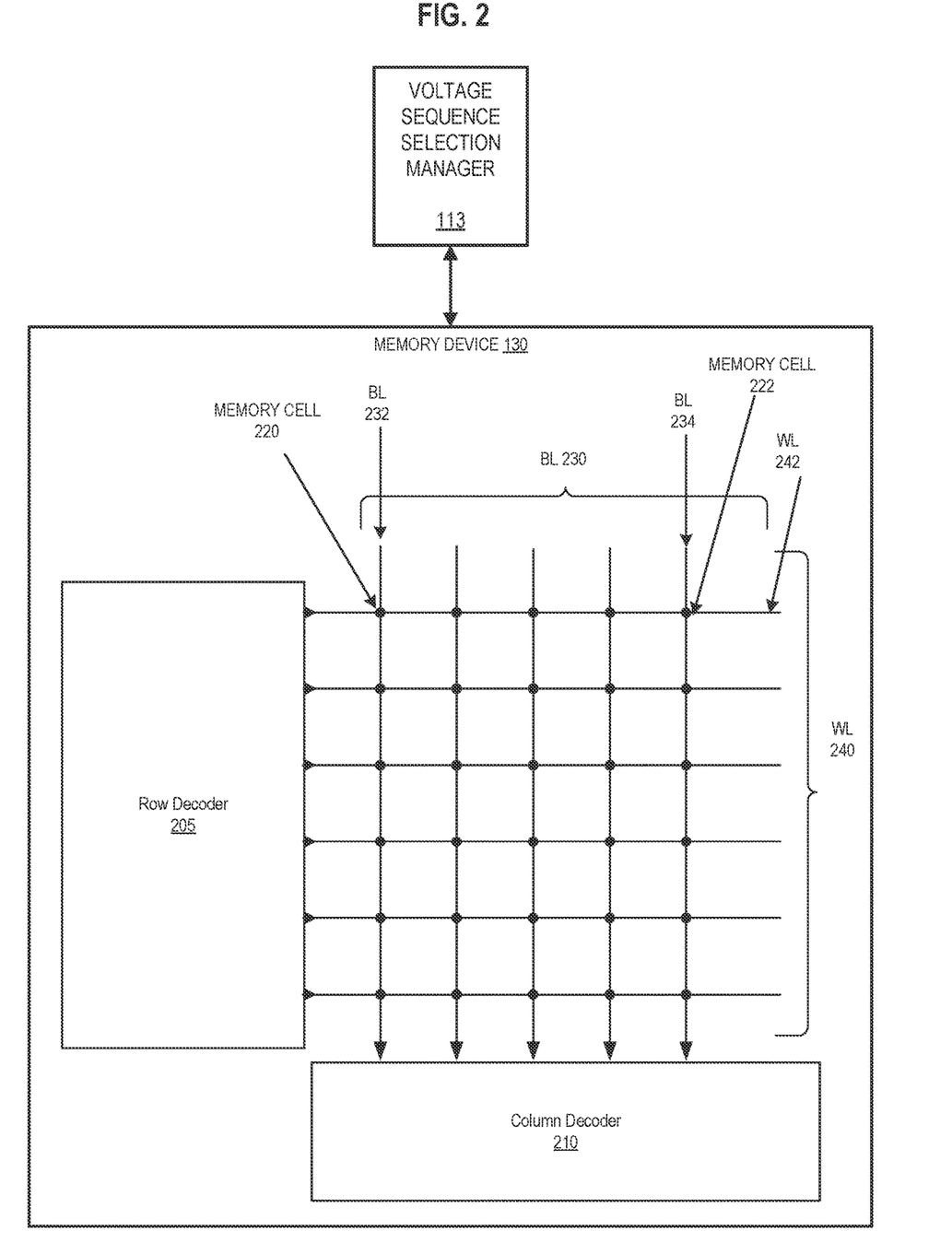
FIG. 2 illustrates an example memory device managed by the voltage sequence selection manager, in accordance with some embodiments of the present disclosure.

FIG. 2 illustrates an example memory device managed by the voltage sequence selection manager 113, in accordance with some embodiments of the present disclosure. The memory device 130 includes an array of memory cells. The memory device 130 illustrates a small number of memory cells for the sake of providing a simple explanation. Embodiments of the memory device 130 can include far greater numbers of memory cells.

Each memory device 130 includes memory cells (e.g., memory cell 220 and memory cell 222) that are accessed via word lines 240 and bit lines 230. For example, the memory device 130 can read a page of memory using word line 242. Within that page, memory cell 220 is accessed via word line 242 and bit line 232. The word lines 230 are coupled to a word line decoder (or row decoder 205) and the bit lines 230 are coupled to a bit line decoder (or column decoder 210). The row decoder 205 and the column decoder 210 are coupled to a controller such as the voltage sequence selection manager 113 and/or another controller.

As shown, memory cell 220 is accessible using word line 242 and bit line 232. Similarly, memory cell 222 is accessible using word line 242 and bit line 234. As described herein, the voltage sequence selection manager 113 can execute a forward read operation as an increasing sequence of threshold voltages (e.g., from lower threshold voltage states of the word line to higher threshold voltage states of the word line). Alternatively, the voltage sequence selection manager 113 can execute a reverse read operation as a decreasing sequence of threshold voltages (e.g., from a higher threshold voltage state of the word line to a lower threshold voltage state of the word line).

Figure 3:
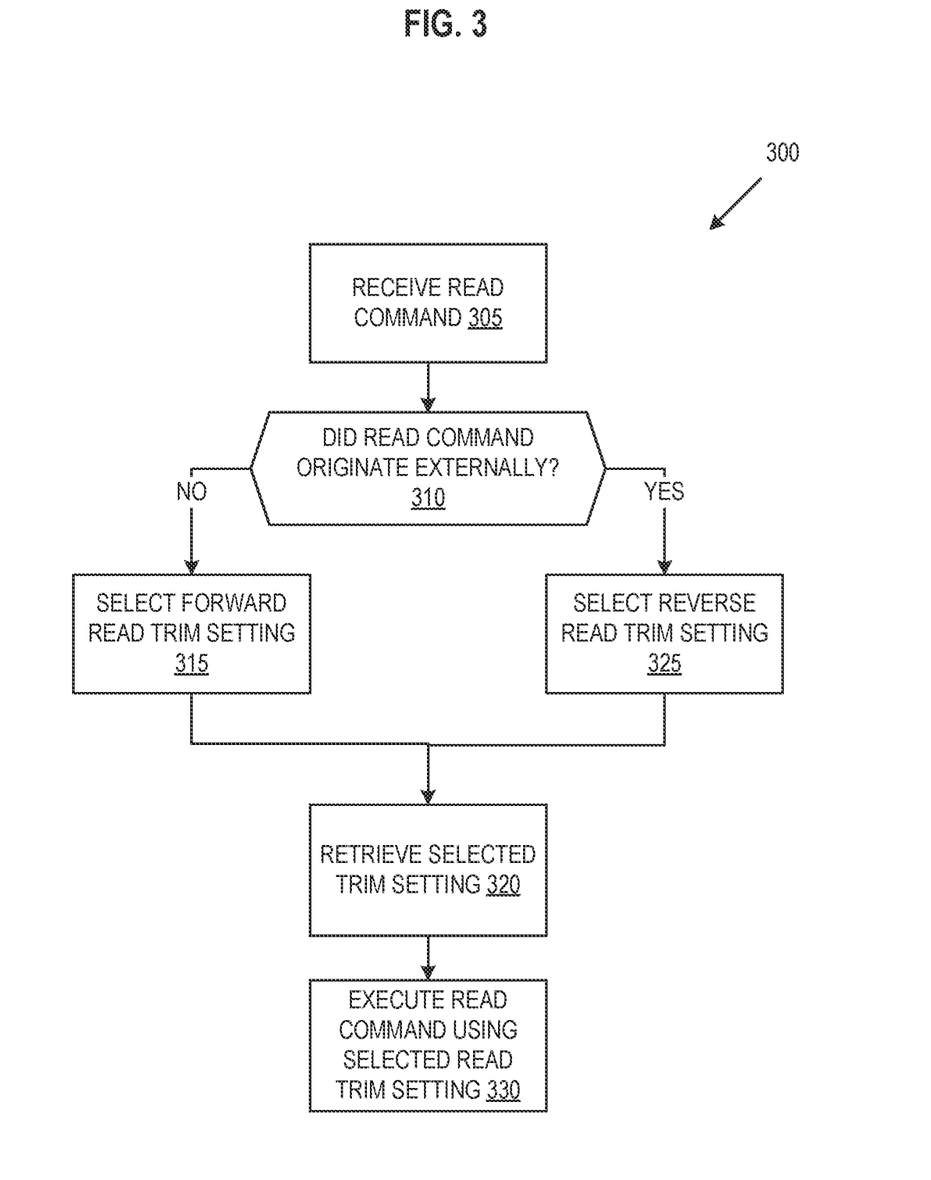
FIG. 3 is a flow diagram of an example method to manage dynamic sequences of read voltages, in accordance with some embodiments of the present disclosure.

FIG. 3 is a flow diagram of an example method 300 to manage dynamic sequences of read voltages, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by a processing device such as the voltage sequence selection manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device receives a read command. As described herein, the read command may originate from a host system and/or memory subsystem 110. That is, the read command may originate externally with respect to the processing device (e.g., originate from the host system) or internally with respect to the processing device (e.g., originate from the memory subsystem 110). In a first non-limiting example, the host system can issue an external read command that directs the memory subsystem 110 to a location in host memory where the read data should be stored (e.g., an external read command).

In a second non-limiting example, the memory subsystem 110 can issue an internal read command to perform one or more background operations (e.g., media scans, garbage collection, etc.). A media scan or integrity scan is an at least partially automated process by which the memory subsystem 110 reads data, performs error correction, and assesses the health of a memory device 130. During these background operations, the memory subsystem 110 moves valid data stored in a block to another block.

At operation 310, the processing device evaluates whether the read command originated externally. For example, the processing devices determines whether the read command was issued externally by a host device or internally within the memory subsystem 110. The processing device can evaluate the origination of the read command using any suitable technique. For example, the processing device can extract origination information of the received read command using the "READ ID" command of the command cycle.

If the processing device determines that the read command originated externally, the method 300 continues to operation 325. If the processing device determines that the read operation did not originate externally (i.e., the read operation originated internally), the method 300 continues to operation 315.

The processing device selects the trim settings according to the origination of the read operation. As described herein, forward read operations are more power efficient than reverse read operations, and reverse read operations are more time efficient than forward read operations. For example, if the read command originated externally, the read command may be issued by a user. Accordingly, the processing device prioritizes time efficiency to reduce the delay experienced by the user and improve user experience with using the memory subsystem. In contrast, if the read command originated internally, the read command may be a background operation. Accordingly, the processing device prioritizes power efficiency such that the power distribution of the memory subsystem is improved (e.g., the battery operating the memory subsystem lasts longer). As such, the user experience using the memory subsystem is improved.

A trim setting is a setting used to execute operations. For example, a trim setting can provide voltage information including a sequence of voltage thresholds corresponding to one or more memory cells, used to program or access memory cells. For example, different voltages can be set when reading a given word line, depending, e.g., on the physical location of the word line within the memory device. Trim settings can also set clock rates, capacitor charge rates, etc. Such settings may be stored in trim registers. Trim settings may be manually determined (e.g., based on tests during manufacturing) and/or automatically determined (e.g., based on one or more optimization algorithms).

At operation 315, the processing device selects the forward read trim setting in response to determining that the read operation originated internally. The forward read trim settings include at least one of a voltage overdrive value, a voltage overdrive timing parameter, and a forward read time parameter. The trim settings are described in more detail with reference to FIG. 4.

At operation 325, the processing device selects the reverse read trim setting in response to determining that the read operation originated externally. The reverse read trim settings include at least one of a voltage underdrive value, a voltage underdrive timing parameter, and a reverse read time parameter. As described herein, the trim settings are described in more detail with reference to FIG. 4.

At operation 320, the processing device retrieves the selected trim setting(s). Trim settings may be stored in one or more trim registers. For example, non-volatile memory (e.g., 130 in FIG. 1) may be configured to store at least two sets of trim settings. A first set of trim settings is the reverse read trim setting including at least one of a voltage underdrive value, a voltage underdrive timing parameter, and a reverse read time parameter. The second set of trim settings is the forward read trim setting including at least one of a voltage overdrive value, a voltage overdrive timing parameter, and a forward read time parameter.

At operation 330, the processing device executes the read command using the selected trim setting. As such, the processing device reads the word line using an increasing sequence of threshold voltages via a forward read operation, or in a decreasing sequence of threshold voltages via a reverse read operation.

Figure 4:
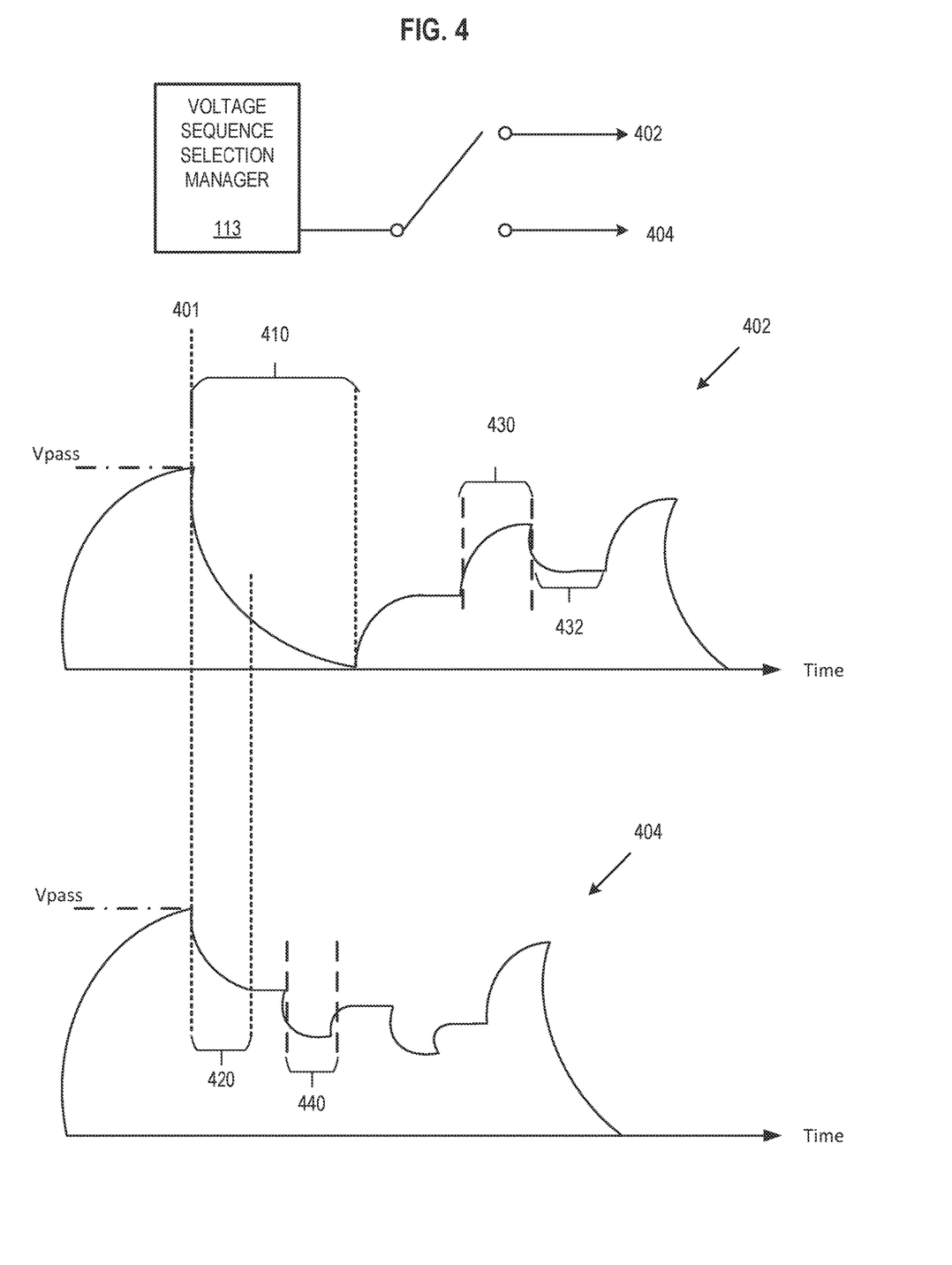
FIG. 4 illustrates example voltage waveforms and annotated trim settings, in accordance with some embodiments of the present disclosure.

FIG. 4 illustrates example voltage waveforms and annotated trim settings, in accordance with some embodiments of the present disclosure. In an example implementation, the voltage sequence selection manager 113 (e.g., the processing device, as described herein) controls the voltage applied to the word line. The voltage sequence selection manager 113 contains logic allowing the voltage sequence selection manager 113 to execute both forward read operations (illustrated via waveform 402) and reverse read operations (illustrated via waveform 404). The voltage sequence selection manager 113 is configured to employ any suitable circuitry/logic/ software to facilitate both forward read operations and reverse read operations. FIG. 4 illustrates a simple illustration of such logic.

Waveforms 402-404 represent voltage waveforms over time across a single selected word line. Waveform 402 indicates the voltage waveform associated with a forward read operation, and waveform 404 indicates the voltage waveform associated with a reverse read operation.

As shown, the voltage of waveform 402 increases until $V_{Pass}$ (e.g., a pass-through voltage), or the voltage required to ensure that the memory cells of the word line are "on." When the voltage of the word line of waveform 402 reaches $V_{Pass}$, the voltage decreases starting at 401 for a duration of time indicated by 410. By discharging the voltage to approximately 0 V, cell reliability is increased as the effects of hot electron injection are reduced. Generally, the processing device does not execute the read operation until the electrons in each channel of each memory cell have been drained. The time it takes before the processing device executes the read operation (e.g., the time indicated by 410) is $T_{read}$, or the read time.

The processing device applies a voltage kick, or a voltage overdrive $V_{OD}$ to ramp the voltage to the next voltage threshold to perform the read operation. The time indicated to apply the $V_{OD}$ is indicated by 430. After the $V_{OD}$ is applied, the voltage stabilizes indicated by plateau 432, and the voltage is sensed such that a portion of the read operation is performed. Waveform 402 provides a simple example and waveforms can include additional voltage kicks and plateaus to perform a forward read operation.

Waveform 404 is similar to waveform 402 in having voltage kicks to quickly change the voltage to a next voltage threshold, and plateaus in which states are sensed (and a portion of the read operation is performed). However, waveform 404 is different from waveform 402 in that waveform 404 illustrates a decreasing sequence of voltage thresholds on the word line, while waveform 402 illustrates an increasing sequence of voltage thresholds on the word line. For example, the voltage kicks (or voltage underdrive $V_{UD}$) are negative voltages (or voltage reductions) with a duration indicated by 440.

While the $V_{UD}$ or $V_{OD}$ are opposite charges (e.g., $V_{UD}$ being a negative voltage and $V_{OD}$ being a positive voltage), the amplitude of $V_{UD}$ and $V_{OD}$ may be the same or different. As described herein, the amplitude (or the value) of $V_{UD}$ and $V_{OD}$ may be manually determined and/or automatically determined. The timing of the $V_{UD}$ and $V_{OD}$ (e.g., 440 and 430 respectively) may be the same or different. As described herein, the $V_{UD}$ and $V_{OD}$ timing parameter may be manually determined and/or automatically determined.

As shown in waveform 404, when the voltage of the word line reaches $V_{Pass}$, the voltage decreases starting at 401 for a duration of time indicated by 420. As shown, duration of time 420 is less than duration of time 410 (e.g., indicated by overlaying the duration of time 420 on the duration of time indicated by 410 in waveform 402). As such, the $T_{read}$ for waveform 404 (e.g., 420) is less than $T_{read}$ for waveform 402 (e.g., 410). This is because the forward read operation is performed on lower threshold voltage states before higher threshold voltage states of the word line. Accordingly, the voltage on the word line must be ramped down to nearly 0 V to improve the reliability of the read operation (and mitigate cell reliability issues).

In contrast, because the reverse read is performed on higher threshold voltage states of a word line before lower threshold voltage states, the voltage on the word line does not need to be ramped down to nearly 0 V, reducing the read time $T_{read}$ of the reverse read operation. Therefore, the $T_{read}$ duration of a reverse read (e.g., 420) is less than the $T_{read}$ duration of a forward read (e.g., 410). The decreased $T_{read}$ duration results in reverse reads being performed faster by the processing device than forward reads. As described herein, the $T_{read}$ timing of the forward read (e.g., the forward read time parameter) and the reverse read (e.g., the reverse read time parameter) may be manually determined (e.g., experimentally) and/or automatically determined (e.g., using one or more optimization algorithms).

While reverse reads are more time efficient (due, in part, to the $T_{read}$ timing differences and the $V_{UD}$ and $V_{OD}$ timing differences), forward reads are more power efficient. Because forward reads begin by reading lower states first, the processing device can employ a "knockout" or "lockout" technique to reduce the memory cells on the word line that are turned on, reducing the power consumed during the read operation. For example, when the processing device employs the knockout technique, the processing device is configured not to sense cells that conducted during previous (lower) state reads, reducing the cell current. During forward read operations, the memory device may be configured to "knockout" or "lockout" memory cells on the word line by grounding various bit lines. In this manner, the knocked-out memory cells satisfying a predefined current level (or voltage level) are turned "off," reducing the overall current (or voltage) associated with the asserted word line. However, during a reverse read operation, the processing device senses the higher states first, necessitating that the lower states are sensed for longer. As such, the current required for a reverse read operation is larger than the current required for a forward read operation.

Figure 5:
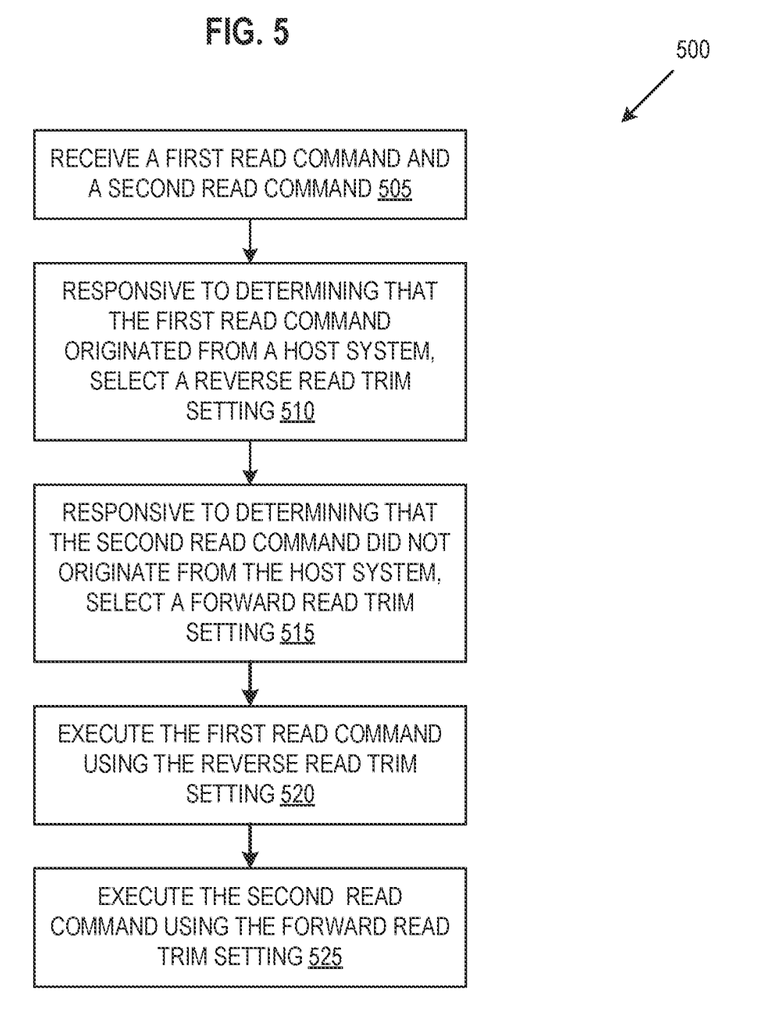
FIG. 5 is a flow diagram of another example method to manage dynamic sequences of read voltages, in accordance with some embodiments of the present disclosure.

FIG. 5 is a flow diagram of another example method 500 to manage dynamic sequences of read voltages, in accordance with some embodiments of the present disclosure. The method 500 can be performed by processing logic that can include hardware (e.g., voltage sequence selection manager 113, circuitry, dedicated logic, programmable logic, microcode, hardware of a device, integrated circuit, etc.), software (e.g., instructions run or executed on a voltage sequence selection manager 113), or a combination thereof. In some embodiments, the method 500 is performed by a processing device such as the voltage sequence selection manager 113 of FIG. 5. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device receives a first read command and a second read command. As described herein, the read commands may originate from a host system and/or memory subsystem 110. That is, the read commands may originate externally with respect to the processing device (e.g., originate from the host system) or internally with respect to the processing device (e.g., originate from the memory subsystem 110).

At operation 510, the processing device selects a reverse read trim setting responsive to determining that the first read command originated from the host system. The processing device can determine that the read command originated from the host system using any suitable technique. For example, the processing device can extract origination information of the first read command using the "READ ID" command of the command cycle. As described herein, a trim setting can provide voltage information, including a sequence of voltage thresholds corresponding to one or more memory cells. Trim settings can include timing parameters and/or voltage values. For example, the reverse read trim setting includes at least one of a voltage underdrive value, a voltage underdrive timing parameter, and a reverse read time parameter.

At operation 515, the processing device selects a forward read trim setting responsive to determining that the second read command did not originate from the host system. As described herein, the processing device can determine that the read command did not originate from the host system using any suitable technique. For example, the processing device can determine that the read command is issued by the memory subsystem 110 as part of one or more background operations (e.g., media scans, garbage collection, etc.). The forward read trim setting includes at least one of a voltage overdrive value, a voltage overdrive timing parameter, and a forward read time parameter.

At operation 520, the processing device executes the first read command using the reverse read trim setting. As such, the processing device reads the word line using a decreasing sequence of threshold voltages via a reverse read operation.

At operation 525, the processing device executes the second read command using the forward read trim setting. As such, the processing device reads the word line using an increasing sequence of threshold voltages via a forward read operation.

Figure 6:
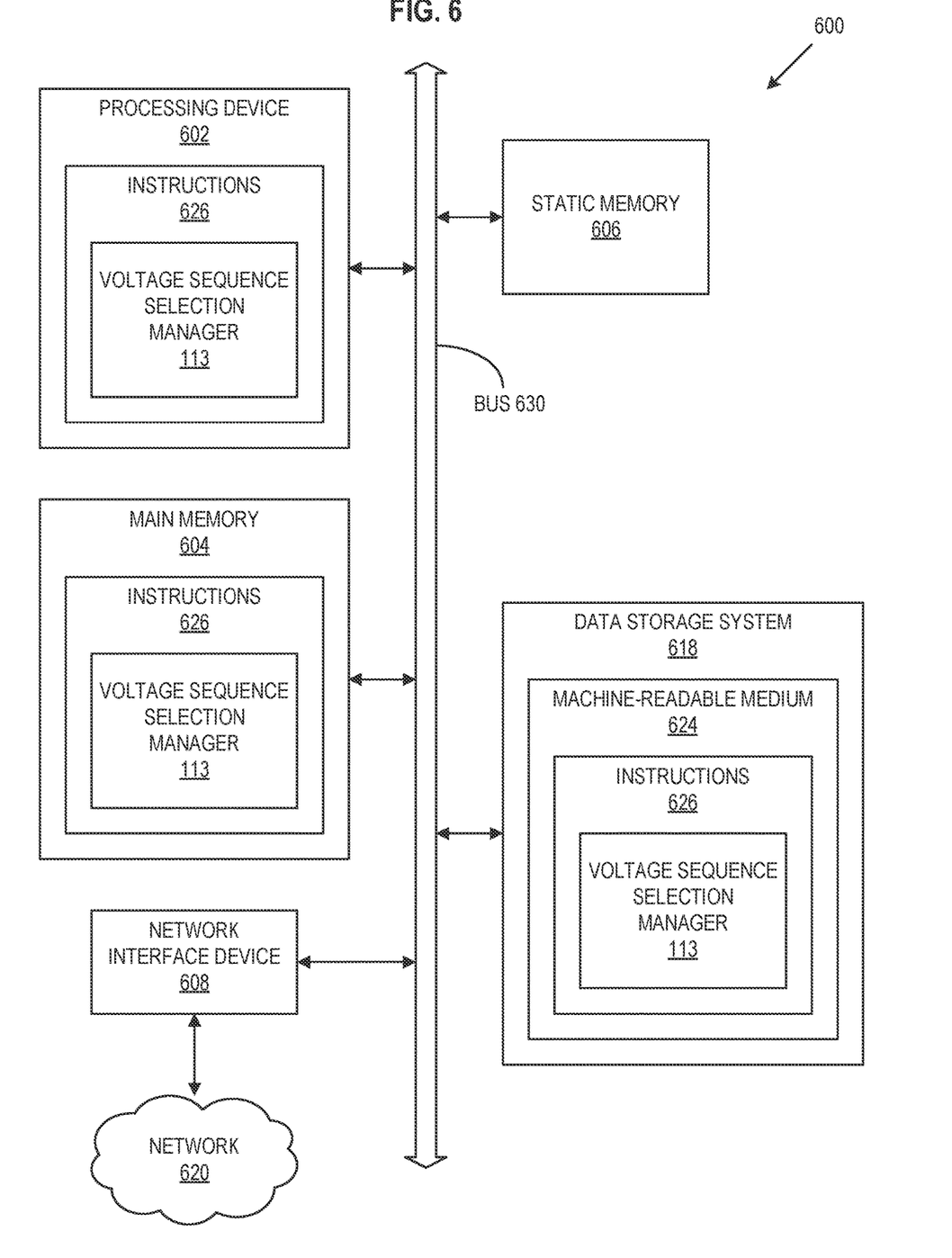
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the voltage sequence selection manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to a voltage sequence selection manager (e.g., the voltage sequence selection manager 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the voltage sequence selection manager 113, may carry out the computer-implemented methods 300 and 500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving a first read command and a second read command;
responsive to determining that the first read command originated from a host system, selecting a reverse read trim setting;
responsive to determining that the second read command did not originate from the host system, selecting a forward read trim setting;
executing the first read command using the reverse read trim setting; and
executing the second read command using the forward read trim setting.

2. The method of claim 1, wherein executing the first read command using the reverse read trim setting includes performing a read operation on higher voltage states before lower voltage states.

3. The method of claim 1, wherein executing the second read command using the forward read trim setting includes performing a read operation on lower voltage states before higher voltage states.

4. The method of claim 1, wherein the reverse read trim setting comprises at least one of a voltage underdrive value, a voltage underdrive timing parameter, and a reverse read time parameter.

5. The method of claim 1, wherein the forward read trim setting comprises at least one of a voltage overdrive value, a voltage overdrive timing parameter, and a forward read time parameter.

6. The method of claim 1, wherein selecting the reverse read trim setting comprises retrieving the reverse read trim setting from a trim register configured to store at least two sets of trim settings including the reverse read trim setting and the forward read trim setting.

7. The method of claim 1, wherein selecting the forward read trim setting comprises retrieving the forward read trim setting from a trim register configured to store at least two sets of trim settings including the reverse read trim setting and the forward read trim setting.

8. A non-transitory computer-readable storage medium comprising instructions that, when executed by a processing device, cause the processing device to:
receive a first read command and a second read command;
responsive to determining that the first read command originated from a host system, selecting a reverse read trim setting;
responsive to determining that the second read command did not originate from the host system, selecting a forward read trim setting;
execute the first read command using the reverse read trim setting; and
execute the second read command using the forward read trim setting.

9. The non-transitory computer-readable storage medium of claim 8, wherein executing the first read command using the reverse read trim setting includes performing a read operation on higher voltage states before lower voltage states.

10. The non-transitory computer-readable storage medium of claim 8, wherein executing second read command using the forward read trim setting includes performing a read operation on lower voltage states of before higher voltage states.

11. The non-transitory computer-readable storage medium of claim 8, wherein the reverse read trim setting comprises at least one of a voltage underdrive value, a voltage underdrive timing parameter, and a reverse read time parameter.

12. The non-transitory computer-readable storage medium of claim 8, wherein the forward read trim setting comprises at least one of a voltage overdrive value, a voltage overdrive timing parameter, and a forward read time parameter.

13. The non-transitory computer-readable storage medium of claim 8, wherein selecting the reverse read trim setting comprises retrieving the reverse read trim setting from a trim register configured to store at least two sets of trim settings including the reverse read trim setting and the forward read trim setting.

14. The non-transitory computer-readable storage medium of claim 8, wherein selecting the forward read trim setting comprises retrieving the forward read trim setting from a trim register configured to store at least two sets of trim settings including the reverse read trim setting and the forward read trim setting.

15. A system comprising:
a memory component; and
a processing device, coupled with the memory component, to:
receive a first read command and a second read command;
responsive to determining that the first read command originated from a host system, selecting a reverse read trim setting from a trim register of the memory component configured to store at least two sets of trim settings including the reverse read trim setting;
responsive to determining that the second read command did not originate from the host system, selecting a forward read trim setting;
executing the first read command using the reverse read trim setting; and
executing the second read command using the forward read trim setting.

16. The system of claim 15, wherein executing the first read command using the reverse read trim setting includes performing a read operation on higher voltage states before lower voltage states.

17. The system of claim 15, wherein executing the second read command using the forward read trim setting includes performing a read operation on lower voltage states of before higher voltage states.

18. The system of claim 15, wherein the reverse read trim setting comprises at least one of a voltage underdrive value, a voltage underdrive timing parameter, and a reverse read time parameter.

19. The system of claim 15, wherein the forward read trim setting comprises at least one of a voltage overdrive value, a voltage overdrive timing parameter, and a forward read time parameter.

20. The system of claim 15, wherein selecting the forward read trim setting comprises retrieving the forward read trim setting from the trim register configured to store the at least two sets of trim settings including the reverse read trim setting and the forward read trim setting.

* * * * *